(12) United States Patent
Xu et al.

(10) Patent No.: US 11,515,336 B2
(45) Date of Patent: Nov. 29, 2022

(54) ARRAY SUBSTRATE, DISPLAY DEVICE AND METHOD FOR REPAIRING WIRE BREAK OF ARRAY SUBSTRATE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Shanshan Xu, Beijing (CN); Wenchao Wang, Beijing (CN); Xu Xu, Beijing (CN); Baoqiang Wang, Beijing (CN)

(73) Assignees: FUZHOU BOE OPTOELECTRONICS TECHNOLOGY CO., LTD., Fujian (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 205 days.

(21) Appl. No.: 16/640,186

(22) PCT Filed: Apr. 23, 2019

(86) PCT No.: PCT/CN2019/083836
§ 371 (c)(1),
(2) Date: Feb. 19, 2020

(87) PCT Pub. No.: WO2019/206124
PCT Pub. Date: Oct. 31, 2019

(65) Prior Publication Data
US 2020/0365458 A1 Nov. 19, 2020

(30) Foreign Application Priority Data
Apr. 28, 2018 (CN) .......................... 201810401165.8

(51) Int. Cl.
*H01L 27/12* (2006.01)
*H01L 21/768* (2006.01)
(Continued)

(52) U.S. Cl.
CPC ...... *H01L 27/124* (2013.01); *G02F 1/136209* (2013.01); *G02F 1/136259* (2013.01);
(Continued)

(58) Field of Classification Search
CPC ......... G02F 1/136209; G02F 1/136259; G02F 1/136263; G02F 1/136272; H01L 27/124; H01L 27/3276
See application file for complete search history.

(56) References Cited

U.S. PATENT DOCUMENTS

| 8,654,269 B2 | 2/2014 | Song et al. |
| 2002/0054248 A1* | 5/2002 | Cheng ............... G02F 1/136259 349/54 |

(Continued)

FOREIGN PATENT DOCUMENTS

| CN | 102141710 A | 8/2011 |
| CN | 203277384 U | 11/2013 |

(Continued)

OTHER PUBLICATIONS

International Search Report received for PCT Patent Application No. PCT/CN2019/083836, dated Aug. 5, 2019, 7 pages (3 pages of English Translation and 4 pages of Original Document).
(Continued)

*Primary Examiner* — Peter M Albrecht
(74) *Attorney, Agent, or Firm* — Womble Bond Dickinson (US) LLP (57) ABSTRACT

An array substrate, a display device, and a method for repairing a broken wire of an array substrate are disclosed. The array substrate includes a substrate, a plurality of
(Continued)

sub-pixel units on the substrate, and a wire and a first conductive light-blocking pattern between two adjacent sub-pixel units of the plurality of sub-pixel units. The first conductive light-blocking pattern is electrically insulated from the wire, and the first conductive light-blocking pattern includes two first regions. Orthographic projections of the two first regions on the substrate overlap with an orthographic projection of the wire on the substrate.

11 Claims, 6 Drawing Sheets

(51) Int. Cl.
  *G02F 1/1362* (2006.01)
  *H01L 27/32* (2006.01)
(52) U.S. Cl.
  CPC .. *G02F 1/136263* (2021.01); *H01L 21/76894* (2013.01); *H01L 27/3276* (2013.01)

(56) References Cited

U.S. PATENT DOCUMENTS

2011/0156995 A1  6/2011  Choi et al.
2012/0268679 A1  10/2012  Song et al.
2016/0370666 A1  12/2016  Gao
2019/0243196 A1  8/2019  Wang et al.

FOREIGN PATENT DOCUMENTS

| CN | 104267534 A | * | 1/2015 | |
| CN | 104880876 A | | 9/2015 | |
| CN | 105549281 A | * | 5/2016 | ....... G02F 1/134309 |
| CN | 105892186 A | * | 8/2016 | ....... G02F 1/136209 |
| CN | 107065369 A | * | 8/2017 | ........... G02F 1/1309 |
| CN | 107065369 A | | 8/2017 | |
| CN | 108594551 A | | 9/2018 | |
| KR | 20010058157 A | * | 7/2001 | ....... G02F 1/136209 |
| KR | 10-2005-0051355 A | | 6/2005 | |
| KR | 20130015992 A | * | 2/2013 | ........... G02F 1/1309 |

OTHER PUBLICATIONS

Office Action received for Chinese Patent Application No. 201810401165.8, dated Jul. 22, 2020, 10 pages (6 pages of English Translation and 4 pages of Office Action).

Office Action received for Chinese Patent Application No. 201810401165.8, dated Oct. 21, 2019, 13 pages (6 pages of English Translation and 7 pages of Office Action).

* cited by examiner

ARRAY SUBSTRATE, DISPLAY DEVICE AND METHOD FOR REPAIRING WIRE BREAK OF ARRAY SUBSTRATE

RELATED APPLICATION

The present application is a 35 U.S.C. 371 national stage application of PCT International Application No. PCT/CN2019/083836, filed on Apr. 23, 2019, which claims the benefit of Chinese Patent Application No. 201810401165.8, filed on Apr. 28, 2018, the contents of which are incorporated herein by reference in their entireties.

TECHNICAL FIELD

The present application relates to the field of display technologies, in particular to an array substrate, a display device and a method for repairing a wire break of an array substrate.

BACKGROUND

During the manufacturing process of a display panel, the wires in the panel, such as the data lines, the scanning lines, the signal lines, etc., may be broken or disconnected. The break of a wire is usually difficult to repair, resulting in a significant reduction in the yield of the products and a corresponding increase in the costs of manufacturing.

SUMMARY

According to an aspect of the present disclosure, there is provided an array substrate, comprising a substrate, a plurality of sub-pixel units on the substrate, and a wire and a first conductive light-blocking pattern between two adjacent sub-pixel units of the plurality of sub-pixel units. The first conductive light-blocking pattern is electrically insulated from the wire, and the first conductive light-blocking pattern comprises two first regions, orthographic projections of the two first regions on the substrate overlap with an orthographic projection of the wire on the substrate.

In some embodiments, each of the plurality of sub-pixel units comprises a common electrode, the common electrode comprises a plurality of strip electrodes arranged at intervals and electrically connected to each other, extension directions of the plurality of strip electrodes are the same as an extension direction of the wire, and the first conductive light-blocking pattern is electrically connected to one of the plurality of strip electrodes closest to the wire.

In some embodiments, the common electrode further comprises a plurality of connection members electrically connected between the plurality of strip electrodes.

In some embodiments, each of the plurality of connection members is electrically connected to an end of a corresponding one of the plurality of strip electrodes.

In some embodiments, the two adjacent sub-pixel units comprise a first sub-pixel unit and a second sub-pixel unit, and one of the strip electrodes of the common electrode of the first adjacent sub-pixel unit closest to the wire is electrically insulated from one of the strip electrodes of the common electrode of the second sub-pixel unit closest to the wire.

In some embodiments, the array substrate further comprises a second conductive light-blocking pattern between the two adjacent sub-pixel units, wherein the second conductive light-blocking pattern is electrically insulated from the wire, the second conductive light-blocking pattern comprises two second regions, and orthographic projections of the two second regions on the substrate overlap with the orthographic projection of the wire on the substrate.

In some embodiments, each of the orthographic projections of the two first regions on the substrate overlaps with a corresponding one of the orthographic projections of the two second regions on the substrate.

In some embodiments, an orthographic projection of the first conductive light-blocking pattern on the substrate and an orthographic projection of the second conductive light-blocking pattern on the substrate are at opposite sides of the orthographic projection of the wire on the substrate.

According to another aspect of the present disclosure, there is provided a display device, comprising the array substrate according to any one of the embodiments of the present disclosure.

According to yet another aspect of the present disclosure, there is provided a method for repairing a wire break of an array substrate, the array substrate comprises a substrate, a plurality of sub-pixel units on the substrate, and a wire and a first conductive light-blocking pattern between two adjacent sub-pixel units of the plurality of sub-pixel units, wherein the first conductive light-blocking pattern is electrically insulated from the wire, and the first conductive light-blocking pattern comprises two first regions, orthographic projections of the two first regions on the substrate overlap with an orthographic projection of the wire on the substrate to form two overlapping areas, the two overlapping areas comprises a first overlapping area and a second overlapping area, the first overlapping area corresponds to a first segment of the first conductive light-blocking pattern and a first segment of the wire, the second overlapping area corresponds to a second segment of the first conductive light-blocking pattern and a second segment of the wire, the wire break is between the first segment of the wire and the second segment of the wire, wherein the method comprises: electrically connecting the first segment of the first conductive light-blocking pattern with the first segment of the wire and the second segment of the first conductive light-blocking pattern with the second segment of the wire.

In some embodiments, each of the plurality of sub-pixel units comprises a common electrode, the common electrode comprises a plurality of strip electrodes arranged at intervals and electrically connected to each other, extension directions of the plurality of strip electrodes are the same as an extension direction of the wire, and the first conductive light-blocking pattern is electrically connected to one of the plurality of strip electrodes closest to the wire, wherein the method further comprises: disconnecting an electrical connection between one of the plurality of strip electrodes electrically connected to the first conductive light-blocking pattern and others of the plurality of strip electrodes.

In some embodiments, electrically connecting the first segment of the first conductive light-blocking pattern with the first segment of the wire and the second segment of the first conductive light-blocking pattern with the second segment of the wire comprises: fusing the first segment of the first conductive light-blocking pattern and the first segment of the wire with laser to electrically connecting the first segment of the first conductive light-blocking pattern with the first segment of the wire, and fusing the second segment of the first conductive light-blocking pattern and the second segment of the wire with laser to electrically connecting the second segment of the first conductive light-blocking pattern with the second segment of the wire.

BRIEF DESCRIPTION OF THE DRAWINGS

Embodiments of the present disclosure are described in more detail and by way of non-limiting examples with reference to the accompanying drawings, in which.

DETAILED DESCRIPTION OF THE EMBODIMENTS

Embodiments of the present disclosure are described in detail below. The embodiments described below are exemplary. They are only used to explain the present disclosure and should not be construed as limiting the present disclosure.

A variety of wires are arranged on the array substrate of a display panel. In the manufacturing process, a wire may be broken due to the existence of particles or the poor stability of the manufacturing process. If a wire is broken and not repaired, the array substrate will become an unqualified product. As a result, the yield will decrease and the cost will increase accordingly. Therefore, there is a need for more research on the method for repairing the array substrate and the broken wires thereon. An array substrate may be provided with various wires such as data lines, scanning lines, signal lines, etc. For ease of understanding, the present disclosure will be described by taking the data line as an example. However, it should be understood that the technical solutions in the present disclosure are equally applicable to other types of wires.

Figure 1:
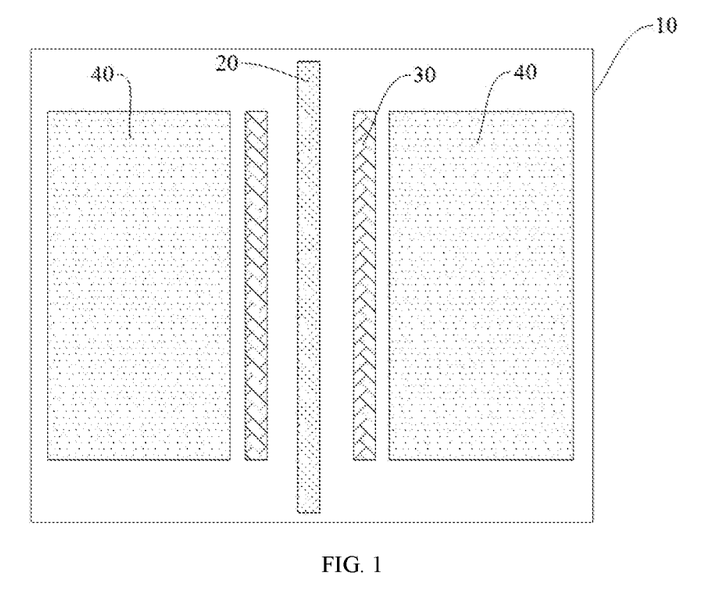
FIG. 1 schematically illustrates a structure of an array substrate in the related art.

FIG. 1 schematically illustrates the structure of an array substrate of the related art. A plurality of sub-pixel units 40 are arranged on the array substrate 10. In order to ensure a good aperture ratio, the space between the sub-pixel units is small. This results in that the repairing methods such as plating tungsten powder cannot be implemented when the data line 20 is broken. Therefore, it is difficult to repair the broken data line. At the same time, there is no other wire in the array substrate 10 that can replace a broken data line. As a result, the array substrate is unavailable for being used, such that the yield is low and the costs are high.

Figure 2A:
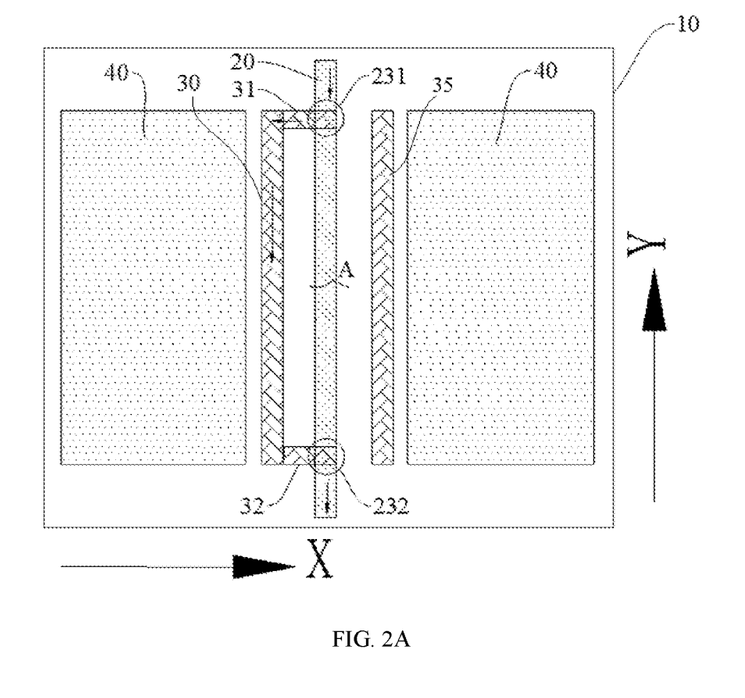
FIGS. 2A and 2B schematically illustrate a top view and a cross-sectional view of an array substrate according to an embodiment of the present disclosure.
Figure 2B:
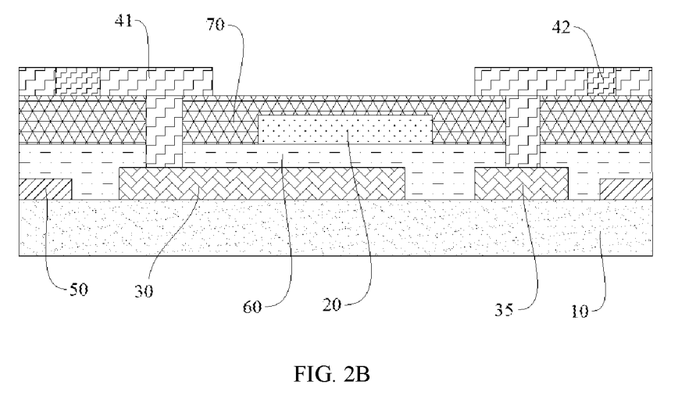
Figure 2C:
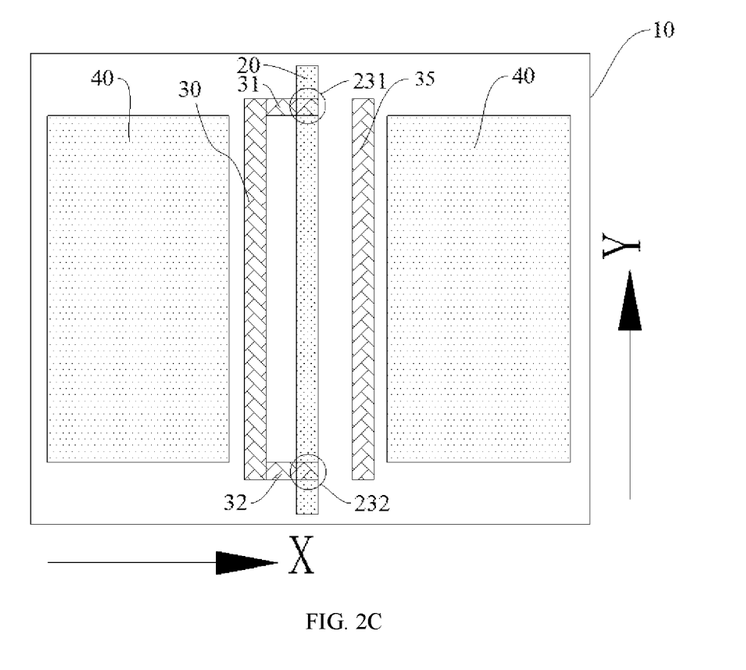
FIG. 2C schematically illustrates a top view of an array substrate according to another embodiment of the present disclosure.
Figure 2D:
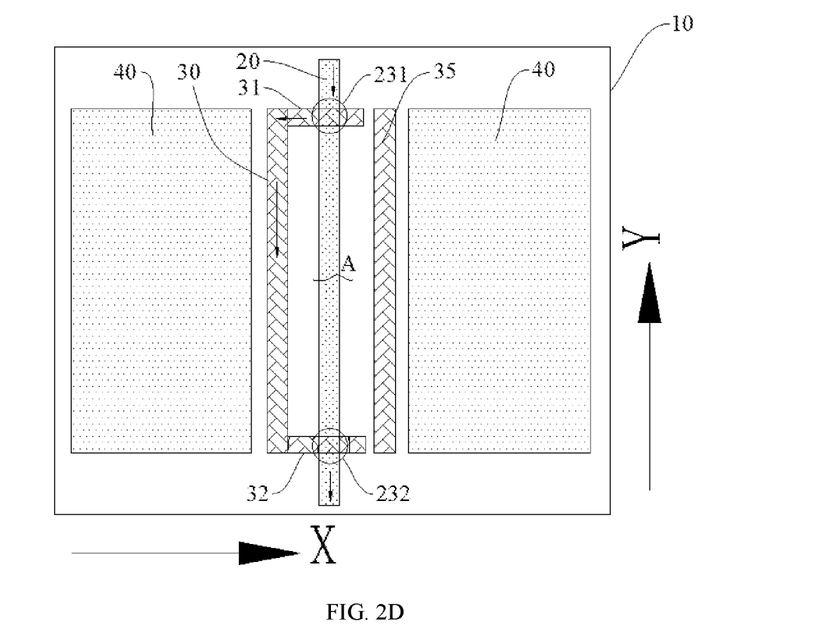
FIG. 2D schematically illustrates a top view of an array substrate according to yet another embodiment of the present disclosure.

According to an aspect of the present disclosure, there is provided an array substrate. FIGS. 2A and 2B schematically illustrate a top view and a cross-sectional view of an array substrate according to an embodiment of the present disclosure. As shown in FIGS. 2A and 2B, the array substrate comprises a substrate 10 and a plurality of sub-pixel units 40 located on the substrate 10. Among the plurality of sub-pixel units 40, a wire (for example, a data line 20) and a first conductive light-blocking pattern 30 are arranged between two adjacent sub-pixel units 40 arranged along a first direction X. The data line 20 and the first conductive light-blocking pattern 30 are insulated from each other and extend in a second direction Y, respectively. The first conductive light-blocking pattern 30 is disposed on the substrate 10. The data line 20 is disposed on a side of the first conductive light-blocking pattern 30 away from the substrate 10. The first conductive light-blocking pattern 30 comprises two first regions 31 and 32. In some embodiments, as shown in FIG. 2A, the first regions 31 and 32 are aligned with the opposite edges of the sub-pixel unit 40 that are arranged in the second direction Y. It should be understood that the first regions 31 and 32 may also be protruding the opposite edges of the sub-pixel unit 40 arranged in the second direction Y. For example, FIG. 2C schematically illustrates a top view of an array substrate according to another embodiment of the present disclosure, in which the two first regions of the first conductive light-blocking pattern 30 are located outside a space defined by the extension lines of the upper and lower edges of the sub-pixel unit 40. The orthographic projections of the first regions 31 and 32 of the first conductive light-blocking pattern 30 on the substrate 10 overlaps with the orthographic projection of the data line 20 on the substrate 10, forming two overlapping areas 231 and 232. The term "overlapping" means that two projections have a coinciding part. The two projections may be completely overlap or partially overlap. One of the two overlapping areas corresponds to a segment of the data line 20 and the other one of the two overlapping areas corresponds to another segment of the data line 20. FIG. 2D schematically illustrates a top view of an array substrate according to yet another embodiment of the present disclosure. The first regions 31 and 32 may extend in the first direction X beyond the overlapping areas (referring to FIG. 2D) and may be aligned with the overlapping areas (refer to FIG. 2A). As shown in FIG. 2A, in some embodiments, the first direction X intersects the second direction Y.

When the data line 20 is not broken, the data line 20 and the first conductive light-blocking pattern 30 are electrically insulated from each other. As shown in FIG. 2B, the data line 20 and the first conductive light-blocking pattern 30 are separated by an insulating layer, in order to not connecting with each other. When the data line 20 is broken and the broken position (i.e., the wire break) occurs between the two segments of the data line corresponding to the two overlapping areas 231 and 232 (such as the A position as shown in FIG. 2A), the segment of the data line corresponding to the first overlapping area 231 can be electrically connected to the segment of the first conductive light-blocking pattern corresponding to the first overlapping area 231, and the segment of the first conductive light-blocking pattern corresponding to the second overlapping area 232 can be electrically connected to the segment of the data line corresponding to the second overlapping area 232. By doing so, the current originally transmitted by the wire can be transmitted by the first conductive light-blocking pattern (e.g., as shown by the arrow in FIG. 2A), thereby realizing the repair of the broken wire. This solves the technical problems that a broken wire is difficult to be repaired in the related art, thereby improving the yield and reducing the cost, and is especially applicable for the array substrate utilizing the vertical slit electrodes, such as an Advanced Super Dimension Switch (abbreviated to ADSDS, ADS for short) display panel.

It should be noted that the expression such as "the conductive light-blocking pattern extends in the second direction" herein means that at least one continuous connection line is formed between a first end and a second end of the conductive light-blocking pattern that is arranged along the second direction, such that a conductive route is formed between the first and second ends.

According to some embodiments of the present disclosure, the specific types of the substrate comprise, but are not limited to, a glass substrate and a polymer substrate, as long as the usage requirements can be met. Those skilled in the art can flexibly choose according to requirements. For example, the substrate may be a conventional substrate known in the art.

According to some embodiments of the present disclosure, the material forming the wire may comprise a metal or a metal alloy, such as copper, silver, molybdenum, aluminum, or a molybdenum tungsten alloy. By selecting proper materials, the electrical conductivity is good, and the source of the material is easy to find.

According to some embodiments of the present disclosure, the conductive light-blocking pattern is mainly used for shielding the area where the light leaks, such as the alignment weak areas, to avoid light leakage. In order to meet the above requirements, the material forming the conductive light-blocking pattern may comprise a metal or a metal alloy, such as molybdenum, aluminum, or a molybdenum tungsten alloy. By doing so, the light leakage can be effectively prevented. Since the conductive light-blocking pattern has the ability to conduct electricity, in the solutions of the present disclosure, when a wire break occurs between segments of the data lines corresponding to the first overlapping area and the second overlapping area, respectively, the conductive light-blocking pattern can be used for repairing the data line in order to help the transmission of data signals, thereby improving the yield.

Figure 3A:
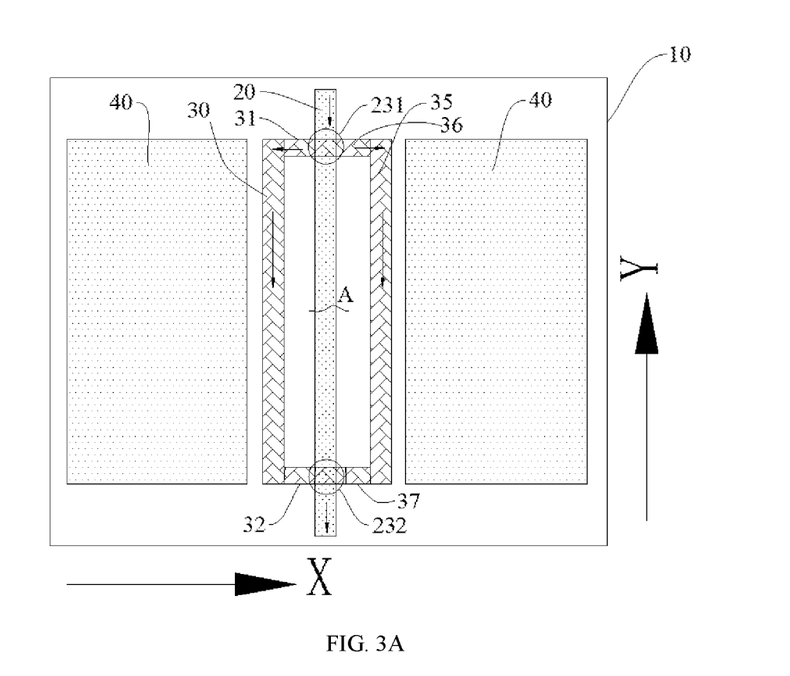
FIGS. 3A and 3B schematically illustrate a top view and a cross-sectional view of an array substrate according to still another embodiment of the present disclosure.
Figure 3B:
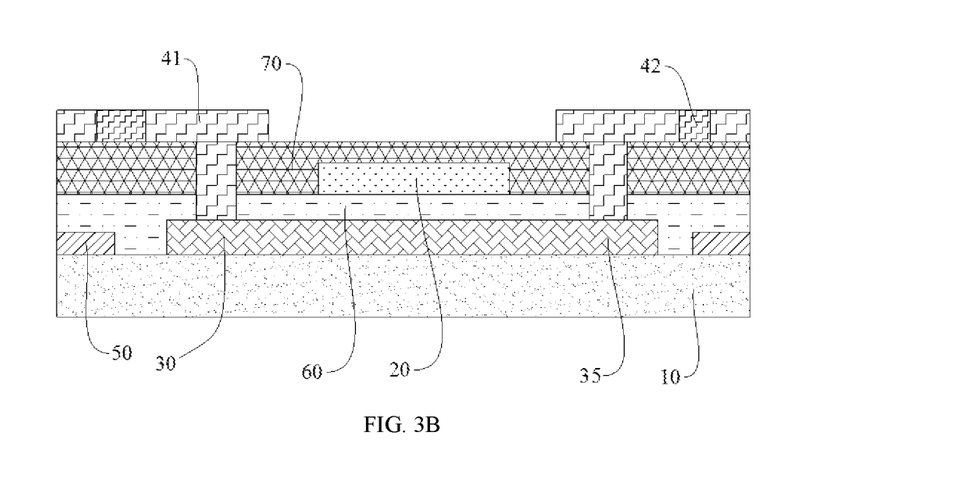

In some embodiments, in order to effectively guarantee the repair of the wire, the array substrate may further comprise a second conductive light-blocking pattern 35 located between the two adjacent sub-pixel units. FIGS. 3A and 3B schematically illustrate a top view and a cross-sectional view of an array substrate according to still another embodiment of the present disclosure. As shown in FIGS. 3A and 3B, the second conductive light-blocking pattern 35 is electrically insulated from the wire 20. The second conductive light-blocking pattern 35 comprises two second regions 36 and 37. The orthographic projections of the two second regions on the substrate overlap with the orthographic projection of the wire on the substrate. The orthographic projection of the first conductive light-blocking pattern 30 on the substrate 10 and the orthographic projection of the second conductive light-blocking pattern 35 on the substrate 10 are located on the opposite sides of the orthographic projection of the wire 20 on the substrate 10.

In some embodiments, the orthographic projection of each of the two first regions on the substrate overlaps with the orthographic projection of a corresponding one of the two second regions on the substrate. More specifically, in some embodiments, each of the two first regions overlap with a corresponding one of the two second regions, that is, the first region 31 coincides with the second region 36, and first region 32 coincides with the second region 37. In other words, the combination of the first conductive light-blocking pattern 30 and the second conductive light-blocking pattern 35 is a closed loop. Therefore, the signal of the wire can be transmitted through the conductive light-blocking patterns on the wire's both sides, such that the reliability is higher. In some other embodiments of the present disclosure, for example, referring to FIG. 2A, the combination of the first conductive light-blocking pattern 30 and the second conductive light-blocking pattern 35 may not be closed, as long as a conductive light-blocking pattern can be used to electrically connect both sides of the broken position of wire 20 when repairing a broken wire. In this way, after the segments of the wire and the segments of the conductive light-blocking pattern corresponding to the overlapping areas are electrically connected, the signal of the wire is transmitted only through one conductive light-blocking pattern.

According to some embodiments of the present disclosure, the electrical connection of the wire and the conductive light-blocking pattern can be achieved by a laser fusing method. By doing so, the method for repairing a wire break according to the embodiments of the present disclosure is easy to operate, has a high success rate, and has a low cost.

It should be noted that when the data line is not broken, the wire and the conductive light-blocking pattern are electrically insulated from each other, as shown in FIGS. 2B and 3B. For example, there may be various insulation layers between the wire and the conductive light-blocking pattern. In addition, the first direction intersects the second direction, but the crossing angle is not limited. Those skilled in the art may design the crossing angle according to the requirements. The perpendicular crossing shown in the drawings is only an embodiment, not a limitation on the crossing angle.

According to some embodiments of the present disclosure, the plurality of sub-pixel units may comprise red sub-pixels, green sub-pixels and blue sub-pixels. According to other embodiments of the present disclosure, the plurality of sub-pixel units may comprise red sub-pixels, green sub-pixels, blue sub-pixels and white sub-pixels. According to yet other embodiments of the present disclosure, the plurality of sub-pixel units may comprise red sub-pixels, green sub-pixels, blue sub-pixels, white sub-pixels and yellow sub-pixels. By doing so, different usage needs can be met.

Figure 4:
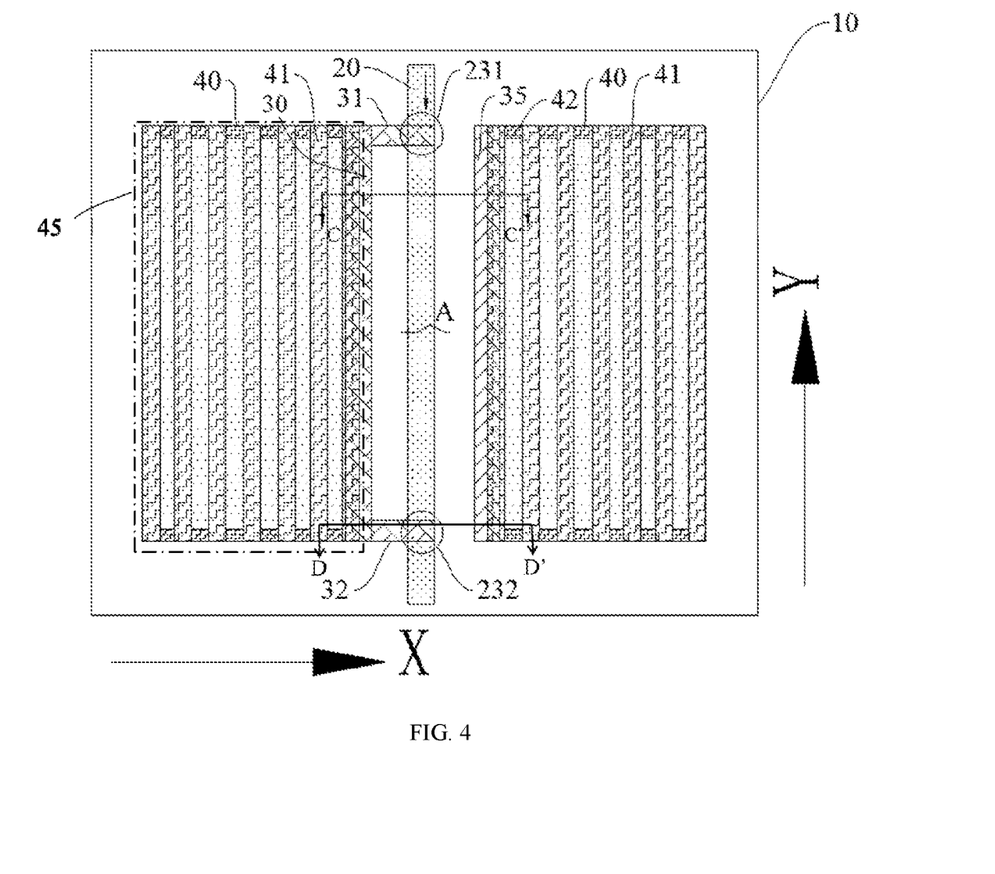
FIG. 4 schematically illustrates a top view of common electrodes of an array substrate according to an embodiment of the present disclosure.

According to some embodiments of the present disclosure, a sub-pixel unit may comprise a common electrode. The conductive light-blocking pattern is connected to the common electrode of the sub-pixel unit adjacent to the same conductive light-blocking pattern. FIG. 4 schematically illustrates a top view of a common electrode according to an embodiment of the present disclosure. In some embodiments, referring to FIG. 4, the common electrode 45 comprises a plurality of strip electrodes 41 that are disposed at intervals in the first direction and are electrically connected to each other. The strip electrodes 41 extend in the second direction, respectively. The first conductive light-blocking pattern 30 is electrically connected to the one of the plurality of strip electrodes that is closest to the data line 20. In a more specific embodiment, the first conductive light-blocking pattern 30 is electrically connected to the one of the plurality of strip electrodes that is closest to it. By doing so, the strip electrode 41 of the common electrode closest to the wire can provide a stable voltage to the conductive light-blocking pattern and prevent the conductive light-blocking pattern from generating a floating electric field the intensity of which cannot be controlled. The common electrode has a vertical slit structure, which is good for disconnecting the electrical connection between (the rest of the strip electrodes of) the common electrode and the conductive light-blocking pattern when using the conductive light-blocking pattern to repair the wire break, avoiding the interaction between the common electrode signal and the wire signal.

In some embodiments, the common electrode further comprises a plurality of connection members. Each of the connection members 42 is located between two adjacent strip electrodes. The strip electrodes 41 are electrically connected to the connection members 42. The connection member 42 is located at the end of the strip electrode 41 in the second direction Y to which the connection member is connected. The connection members 42 electrically connect the plurality of strip electrodes 41 to ensure that the common electrode has a stable voltage.

The connection manner of the conductive light-blocking pattern and the strip electrode 41 of the common electrode closest to the wire can be selected as required. For example, referring to FIGS. 4 and 3B, overlapping areas exist between the orthographic projection of the strip electrode 41 closest to the wire among the common electrode on the substrate and the orthographic projection of the conductive light-blocking pattern on the substrate. Therefore, by providing via holes in the insulating layer at locations corresponding to the overlapping areas of the segments of the strip electrode and the segments of the conductive light-blocking pattern, the conductive light-blocking pattern and the strip electrode 41 of the common electrode closest to the data line 20 could be electrically connected. This connection manner is simple to operate and easy to implement.

According to the embodiment of the present disclosure, in order to reduce the load of the data line, as shown in FIG. 4, for two adjacent sub-pixel units 40, the strip electrode of the common electrode of one sub-pixel unit closest to the wire are not directly connected to the strip electrode of the common electrode of the other sub-pixel unit closest to the same wire. In other words, there is no connection route between the above two strip electrodes to directly connecting them. More specifically, in the perspective of FIG. 4, the rightmost strip electrode of the left common electrode and the leftmost strip electrode of the right common electrode are not connected to each other. Therefore, in a direction perpendicular to the substrate, there is no overlapping area between the data line and the common electrode, such that there is no capacitance being generated, thereby reducing the load of the data line and improving its performance.

According to some embodiments of the present disclosure, the strip electrodes of the common electrode are transparent electrodes, such that the light transmission will not be affected. The material forming the strip electrodes comprises, but is not limited to, a transparent conductive oxide, such as indium tin oxide. By doing so, the conductive property is good and the use effect is good too.

Figure 5:
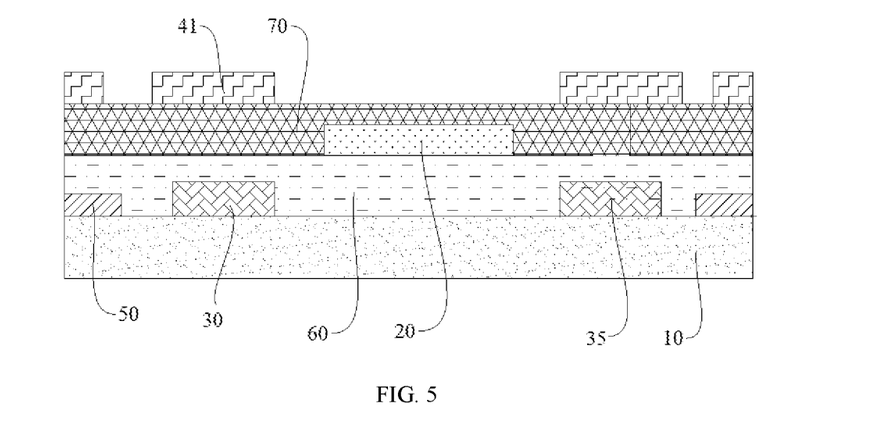
FIG. 5 schematically illustrates another cross-sectional view of an array substrate according to an embodiment of the present disclosure.

FIG. 5 schematically illustrates a cross-sectional view of the array substrate of FIG. 4 along the line C-C'. As shown in FIG. 5, the first conductive light-blocking pattern 30 and the pixel electrode 50 are provided on the surface of the substrate 10. A first insulating layer 60 is formed on the surface of the substrate 10 and covers the first conductive light-blocking pattern 30 and the pixel electrode 50. The data line 20 is disposed on a side of the first insulating layer 60 away from the substrate 10, and its orthographic projection on the substrate does not overlap with the orthographic projection of the first conductive light-blocking pattern 30 on the substrate. A second insulating layer 70 is formed on a side of the first insulating layer 60 away from the substrate 10 and covers the data lines 20. The strip electrodes 41 are provided on a side of the second insulating layer 70 away from the substrate 10.

Figure 6A:
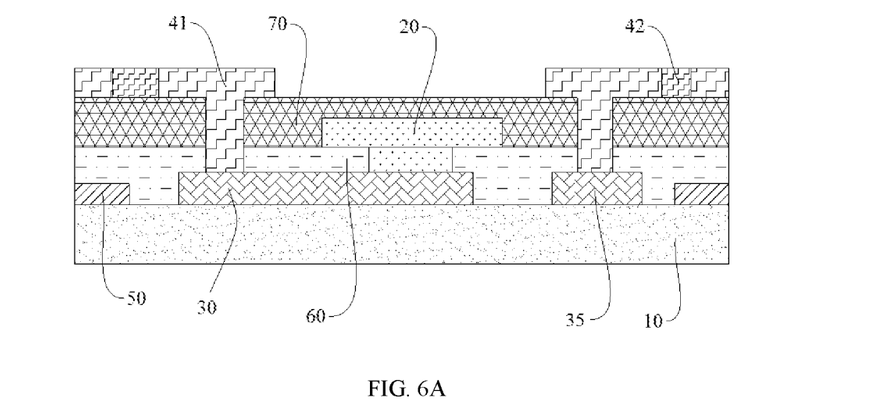
FIGS. 6A and 6B schematically illustrate cross-sectional views of array substrates after repaired by using a method for repairing a wire break of an array substrate according to an embodiment of the present disclosure.
Figure 6B:
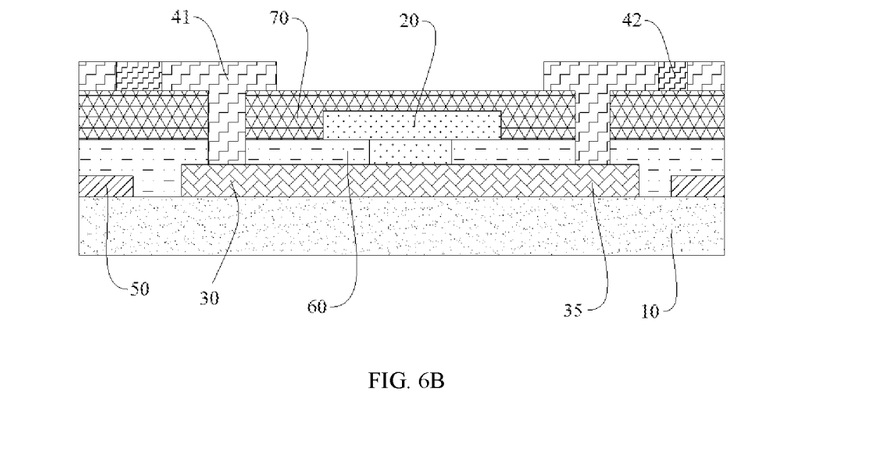

The cross section along the line D-D' is different from the cross section along the line C-C' because the D-D' section comprises the first region of the first conductive light-blocking pattern. The cross section along the line D-D 'is shown in FIG. 2B. With respect to the line D-D', the orthographic projection of the data line 20 on the substrate and the orthographic projection of the first conductive light-blocking pattern 30 on the substrate form overlapping areas. The strip electrode 41 closest to the data line 20 is electrically connected to the first conductive light-blocking pattern 30 through via holes. The array substrate as shown in FIG. 2B is in a state where the data line is not broken. FIGS. 6A and 6B schematically show cross-sectional views of the structures of array substrates after being repaired. If the data line is broken and the position of the break is between the segments of the wire corresponding to the overlapping areas, the data line could be repaired. In some embodiments, the segment of the conductive light-blocking pattern corresponding to the overlapping area and the segment of the data line corresponding to the same overlapping area can be electrically connected by a certain method (for example, by laser fusing), thereby overcoming the problem of wire break.

Apparently, those skilled in the art can understand that, in addition to the wires, the conductive light-blocking patterns and the common electrodes described above, the array substrate may also comprise other structures or components, such as thin film transistors, pixel electrodes and planarization layers.

In some embodiments, when the position of wire break is not located between the segments of the wire corresponding to the overlapping areas, the space for repair is relatively large because this situation means that the wire break is located in the circuit distribution area rather than the display area. Therefore, the repair of the break of the data line can be realized by plating tungsten powder.

According to another aspect of the present disclosure, there is provided a display device. The display device comprises the array substrate according to the embodiments of the present disclosure. Such a display device has an improved yield and a reduced cost. This display device has all the features and advantages of the array substrate described above, which will not be described in detail again. The specific type of the above mentioned display device is not limited, and those skilled in the art can flexibly choose according to actual conditions. In the embodiments of the present disclosure, the above mentioned display device may be a mobile phone, a tablet computer, a television, a gaming device, or any electronic device with a display function.

The above display device may comprise other structures or components in addition to the array substrate, such as a color film substrate, a liquid crystal layer, a cover plate, a sound processing module, a camera module, a fingerprint module, a CPU processor, etc.

Figure 7:
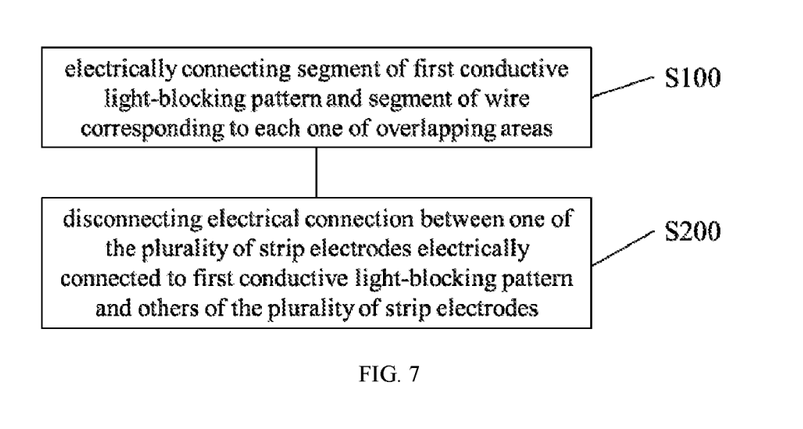
FIG. 7 schematically illustrates a flowchart of a method of repairing a wire break of an array substrate according to an embodiment of the present disclosure.

In yet another aspect of the present disclosure, there is provided a method for repairing a wire break of an array substrate. FIG. 7 schematically shows a flowchart of the method. The location of the break is between the segments of the wires corresponding to the two overlapping areas. The method comprises the step of: electrically connecting the segment of the first conductive light-blocking pattern and the segment of wire corresponding to each one of the overlapping areas (step S100). After the electrical connection, the signal can be transmitted through the conductive light-blocking pattern (see the arrow in FIG. 2A). In this way, the above-mentioned repair of the wire break is realized, the technical problem of the difficulty of repair is solved, the yield of the product is improved, and the cost is reduced.

Figure 8:
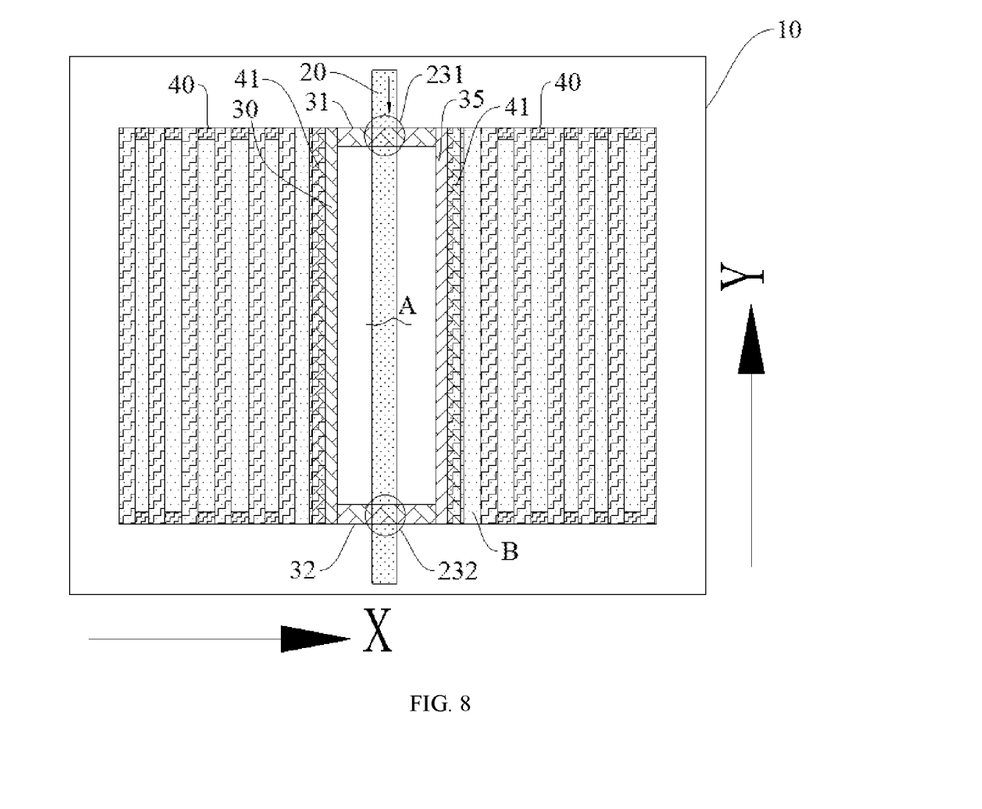
FIG. 8 schematically illustrates a top view of an array substrate after repaired by using a method for repairing a wire break of an array substrate according to an embodiment of the present disclosure.

In some embodiments, step S100 may be implemented by a laser fusing method. By doing so, the operation is easy, the success rate is high, and the implementation cost is low. In some embodiments, the sub-pixel unit 40 comprises a common electrode, which comprises a plurality of strip electrodes 41 arranged at intervals and electrically connected to each other. The strip electrode extends in the same direction as the wire. The first conductive light-blocking pattern 30 is connected to the strip electrode 41 closest to the wire 20 among the common electrodes. The method further comprises: disconnecting an electrical connection between one of the plurality of strip electrodes 41 electrically connected to the first conductive light-blocking pattern and others of the plurality of strip electrodes. (Step S200). For example, the connection members between the strip electrodes can be cut off. FIG. 8 schematically illustrates a top view of the array substrate after the connection members are cut off, wherein the connection members at the location B are cut off. Therefore, the requirements of providing a stable voltage for the conductive light-blocking pattern can be met, and the requirement that the data line is not connected to the common electrode can be realized, in order to avoid mutual interference between the data signal and the common electrode signal, thereby improving the yield and the competitiveness in the market.

According to some embodiments of the present disclosure, the above repair method may be used to repair a situation where a wire of the foregoing array substrate is broken at a corresponding position. All the requirements for the various structures such as the wires, the conductive light-blocking patterns, the strip electrodes, etc. are consistent, and will not be described here in detail again.

In summary, the present disclosure provides an array substrate, a display device, and a method for repairing a wire break of an array substrate. The array substrate comprises a substrate, a plurality of sub-pixel units on the substrate, and a wire and a first conductive light-blocking pattern between two adjacent sub-pixel units of the plurality of sub-pixel units. The first conductive light-blocking pattern is electrically insulated from the wire, and the first conductive light-blocking pattern comprises two first regions. Orthographic projections of the two first regions on the substrate overlap with an orthographic projection of the wire on the substrate. The conductive light-blocking pattern can be used for repairing data lines, in order to help completing the transmission of data signals, thereby improving the product yield.

In the description of this disclosure, it needs to be understood that the positional or directional relationship identified by the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential", etc. are used based on the directional or positional relationships shown in the drawings, and are only for the convenience of describing the present disclosure and simplifying the description, rather than indicating or implying that the referred device or element must have a specific orientation, be constructed or operated in a specific orientation, and therefore cannot be understood as a limitation on this disclosure.

In addition, the terms such as "first" and "second" etc. are used for descriptive purposes only, and cannot be understood as indicating or implying relative importance or implicitly indicating the amount of the referred technical feature. Therefore, the features defined with "first" or "second" etc. may explicitly or implicitly comprise one or more of the features. In the description of the present disclosure, the meaning of the term "a plurality of" is two or more, unless specifically defined otherwise.

In this disclosure, the terms such as "installation", "connection", "connecting" and "fixed" should be understood broadly unless otherwise defined. For example, these terms can represent a fixed connection, a detachable connection, or an integral unit; a mechanical connection or an electrical connection; a direct connection or an indirect connection through an intermediate medium; and two components being internally connected or having an interaction. For a person having ordinary skill in the art, the specific meanings of the above terms in the present disclosure can be understood according to specific situations.

In this disclosure, unless explicitly stated and defined otherwise, the expressions such as "the first feature is on or below the second feature" may comprises the situations that the first and second features are in direct contact, or the first and second features are indirectly connected through an intermediate medium. Moreover, the expression such as "the first feature is above the second feature" and "the first feature is on the second feature" may comprise the situations that the first feature is directly above or obliquely above the second feature, or only indicates that the height of the first feature is higher than the height of the second feature with reference to the horizontal level. The term such as "the first feature is below the second feature" and "the first feature is under the second feature" may comprises the situations that the first feature may be directly below or obliquely below the second feature, or it may simply indicate that the height of the first feature is lower than the height of the second feature with reference to the horizontal level.

In the description of this specification, the description with reference to the terms "an embodiment", "some embodiments", "examples", "specific examples" or "some examples" and the like means that the specific features, structure, material, or characteristic described in conjunction with these embodiments or examples are comprised in at least one embodiment or example of the present disclosure. In this specification, the exemplary expressions of the above terms are not necessarily directed to the same embodiment or example. Moreover, the described specific features, structures, materials or characteristics may be combined in any suitable manner in any one or more embodiments or examples. In addition, those skilled in the art may combine different embodiments or examples or combine features of the different embodiments or examples described in this specification, if the resulting technical solutions do not conflict.

Although the embodiments of the present disclosure have been shown and described above, it can be understood that the above embodiments are exemplary and should not be construed as limitations on the present disclosure. Those skilled in the art can make changes, modifications, replacements, and variations to the above-mentioned embodiments within the scope of the present disclosure.

We claim:

1. An array substrate, comprising:
a substrate,
a plurality of sub-pixel units on the substrate, and
a wire and a first conductive light-blocking pattern between two adjacent sub-pixel units of the plurality of sub-pixel units,
wherein the first conductive light-blocking pattern is electrically insulated from the wire, and the first conductive light-blocking pattern comprises two first regions, orthographic projections of the two first regions on the substrate overlap with an orthographic projection of the wire on the substrate,
wherein each of the plurality of sub-pixel units comprises a common electrode, the common electrode comprises a plurality of strip electrodes arranged at intervals and electrically connected to each other, extension directions of the plurality of strip electrodes are the same as an extension direction of the wire, and the first conductive light-blocking pattern is electrically connected to and physically connected to one of the plurality of strip electrodes closest to the wire.

2. The array substrate of claim 1, wherein the common electrode further comprises a plurality of connection members arranged among and electrically connecting the plurality of strip electrodes.

3. The array substrate of claim 2, wherein each of the plurality of connection members is electrically connected to an end of a corresponding one of the plurality of strip electrodes.

4. The array substrate of claim 1, wherein the two adjacent sub-pixel units comprise a first sub-pixel unit and a second sub-pixel unit, and the one of the strip electrodes of the common electrode of the first sub-pixel unit closest to the wire is electrically insulated from the one of the strip electrodes of the common electrode of the second sub-pixel unit closest to the wire.

5. The array substrate of claim 1, further comprising a second conductive light-blocking pattern between the two adjacent sub-pixel units,
wherein the second conductive light-blocking pattern is electrically insulated from the wire, the second conductive light-blocking pattern comprises two second regions, and orthographic projections of the two second regions on the substrate overlap with the orthographic projection of the wire on the substrate.

6. The array substrate of claim 5, wherein each of the orthographic projections of the two first regions on the substrate overlaps with a corresponding one of the orthographic projections of the two second regions on the substrate.

7. The array substrate of claim 5, wherein an orthographic projection of the first conductive light-blocking pattern on the substrate and an orthographic projection of the second conductive light-blocking pattern on the substrate are at opposite sides of the orthographic projection of the wire on the substrate.

8. A display device, comprising the array substrate according to claim 1.

9. A method for repairing a wire break of an array substrate, the array substrate comprising a substrate, a plurality of sub-pixel units on the substrate, and a wire and a first conductive light-blocking pattern between two adjacent sub-pixel units of the plurality of sub-pixel units, wherein the first conductive light-blocking pattern is electrically insulated from the wire, and the first conductive light-blocking pattern comprises two first regions, orthographic projections of the two first regions on the substrate overlap with an orthographic projection of the wire on the substrate to form two overlapping areas, the two overlapping areas comprise a first overlapping area and a second overlapping area, the first overlapping area corresponds to a first segment of the first conductive light-blocking pattern and a first segment of the wire, the second overlapping area corresponds to a second segment of the first conductive light-blocking pattern and a second segment of the wire, the wire break is between the first segment of the wire and the second segment of the wire, wherein each of the plurality of sub-pixel units comprises a common electrode, the common electrode comprises a plurality of strip electrodes arranged at intervals and electrically connected to each other, extension directions of the plurality of strip electrodes are the same as an extension direction of the wire, and the first conductive light-blocking pattern is electrically connected to and physically connected to one of the plurality of strip electrodes closest to the wire,
wherein the method comprises:
electrically connecting the first segment of the first conductive light-blocking pattern with the first segment of the wire and the second segment of the first conductive light-blocking pattern with the second segment of the wire.

10. The method of claim 9, further comprising:
disconnecting an electrical connection between the one of the plurality of strip electrodes electrically connected to the first conductive light-blocking pattern and others of the plurality of strip electrodes.

11. The method of claim 9, wherein electrically connecting the first segment of the first conductive light-blocking pattern with the first segment of the wire and the second segment of the first conductive light-blocking pattern with the second segment of the wire comprises:
fusing the first segment of the first conductive light-blocking pattern and the first segment of the wire with a laser to electrically connect the first segment of the first conductive light-blocking pattern with the first segment of the wire, and
fusing the second segment of the first conductive light-blocking pattern and the second segment of the wire with the laser to electrically connect the second segment of the first conductive light-blocking pattern with the second segment of the wire.

* * * * *